(12) United States Patent
Zhang

(10) Patent No.: US 7,038,509 B1
(45) Date of Patent: May 2, 2006

(54) METHOD AND SYSTEM FOR PROVIDING A PHASE-LOCKED LOOP WITH REDUCED SPURIOUS TONES

(75) Inventor: Benyong Zhang, Auburn, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 122 days.

(21) Appl. No.: 10/694,450

(22) Filed: Oct. 27, 2003

(51) Int. Cl.
*H03L 7/06* (2006.01)

(52) U.S. Cl. .................. 327/157; 331/17; 375/376

(58) Field of Classification Search ............... 327/147, 327/148, 156, 157, 150, 159; 375/373–376; 331/DIG. 2, 17, 1 A, 16
See application file for complete search history.

(56) References Cited

U.S. PATENT DOCUMENTS

| 3,928,813 | A | | 12/1975 | Kingsford-Smith |
| 4,204,174 | A | | 5/1980 | King |
| 4,206,425 | A | | 6/1980 | Nossen |
| 4,458,214 | A | * | 7/1984 | Lakomy ................. 331/1 A |
| 4,609,881 | A | | 9/1986 | Wells |
| 4,815,018 | A | | 3/1989 | Reinhardt et al. |
| 4,974,211 | A | * | 11/1990 | Corl ........................... 367/7 |
| 5,038,120 | A | | 8/1991 | Wheatley et al. |
| 5,124,670 | A | | 6/1992 | Lawton |
| 5,920,233 | A | * | 7/1999 | Denny ........................ 331/14 |
| 6,114,888 | A | * | 9/2000 | Walley ....................... 327/157 |
| 6,223,061 | B1 | * | 4/2001 | Dacus et al. ................ 455/574 |
| 6,570,457 | B1 | * | 5/2003 | Fischer ........................ 331/17 |

OTHER PUBLICATIONS

Tadao Nakagawa et al., "A Phase Noise Reduction Technique for MMIC Frequency Synthesizers that Uses a New Pulse Generator LSI", IEEE Transactions on Microwave Theory and Techniques, vol. 42, No. 12, Dec. 1994, Pp. 2579-2582.

Tom A. D. Riley et al., "Delta-Sigma Modulation in Fractional-N Frequency Synthesis", IEEE Journal of Solid-State Circuits, vol. 28, No. 5, May 1993, Pp. 553-559.

Brian Miller et al., "A Multiple Modulator Fractional Divider" Forty-Fourth Annual Symposium on Frequency Control, IEEE, 1990, Pp. 559-568.

* cited by examiner

*Primary Examiner*—Minh Nguyen

(57) ABSTRACT

A method for providing a phase-locked loop with reduced spurious tones is provided that includes comparing a reference clock signal to an internal clock signal to generate a first signal. The first signal is sampled based on a sampling clock signal to generate a second signal. The sampling clock signal is reduced with respect to the reference clock signal. The internal clock signal is generated based on the second signal.

20 Claims, 4 Drawing Sheets

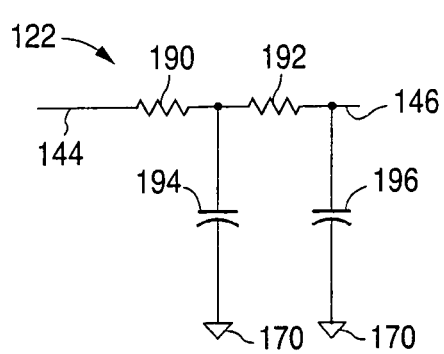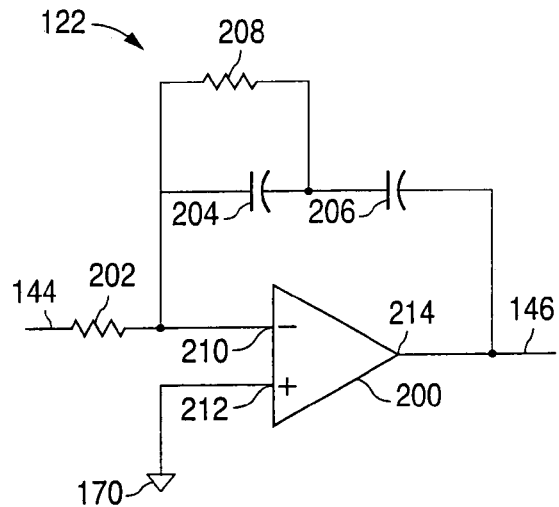
FIG. 4A   FIG. 4B
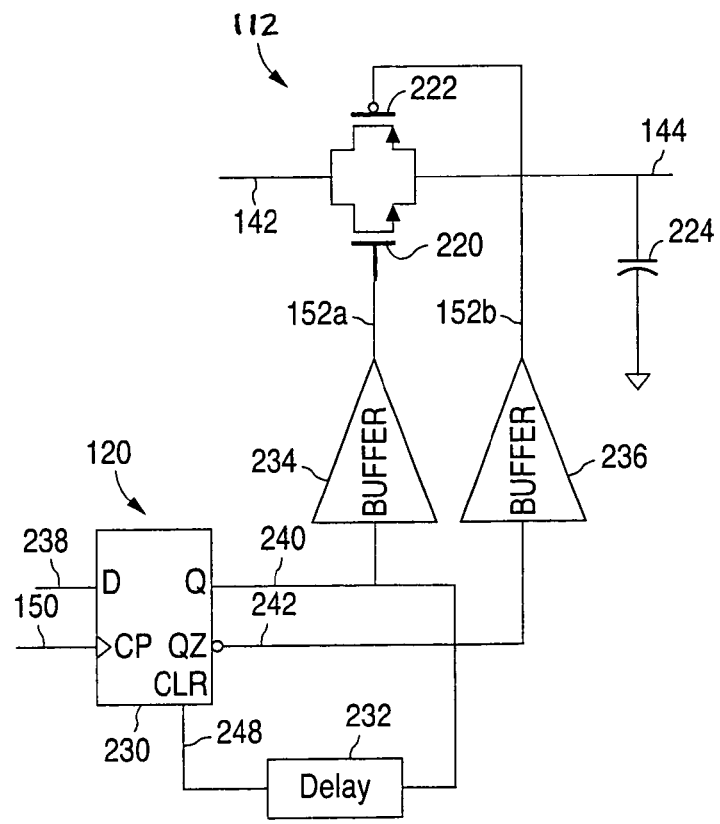
FIG. 5

METHOD AND SYSTEM FOR PROVIDING A PHASE-LOCKED LOOP WITH REDUCED SPURIOUS TONES

TECHNICAL FIELD OF THE INVENTION

The present invention relates generally to phase-locked loops and, more particularly, to a method and system for providing a phase-locked loop with reduced spurious tones.

BACKGROUND OF THE INVENTION

For wireless communication systems, local oscillator signals for frequency translation of received and/or transmitted signals are generated by phase-locked loop (PLL) frequency synthesizers. PLLs are also widely used in other electronic systems. For example, PLLs may be used as clock generators for high performance microprocessors.

Key performance parameters of a PLL include phase noise, spurious response, lock time, cost and power consumption. The spurious tones can degrade performance for both transmitters and receivers. For transmitters using a local oscillator signal having high spurious tones, the transmitted signal can cause excessive emission power in adjacent channels. For receivers, the spurious tones of a local oscillator signal down-convert undesired noises to baseband. Thus, system noise performance can be degraded. For high performance wireless cellular communication systems, low phase noise and low spurious tones are typically required to improve receiver sensitivity performance and to reduce the effects of blocking signals.

For PLL frequency synthesizers, spurious tones might occur in the output spectrum for several reasons. First, non-ideal performance of analog circuitry, such as charge pump delay and amplitude mismatch, leakage current, oscillator gain non-linearity and the like, causes limit cycle during steady-state. Second, fractional-N dividers, which are used in some cases to improve phase noise, can introduce phase disturbance to the PLL and result in spurious tones.

One technique to reduce spurious tones is based upon sampling the output of a small on-chip integration capacitor, which averages out the phase error. However, the conventional sampling technique suffers from saturation effect, which degrades system transient performance and requires a complex anti-saturation circuit to achieve a lock.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which:

FIG. 4A is a circuit diagram illustrating the optional low pass filter of FIG. 1 in accordance with one embodiment of the present invention;

FIG. 4B is a circuit diagram illustrating the optional low pass filter of FIG. 1 in accordance with another embodiment of the present invention;

FIG. 5 is a circuit diagram illustrating the sampling circuit and the clock/buffer circuit of FIG. 1 in accordance with one embodiment of the present invention.

DETAILED DESCRIPTION OF THE INVENTION

FIGS. 1 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase-locked loop.

Figure 1:
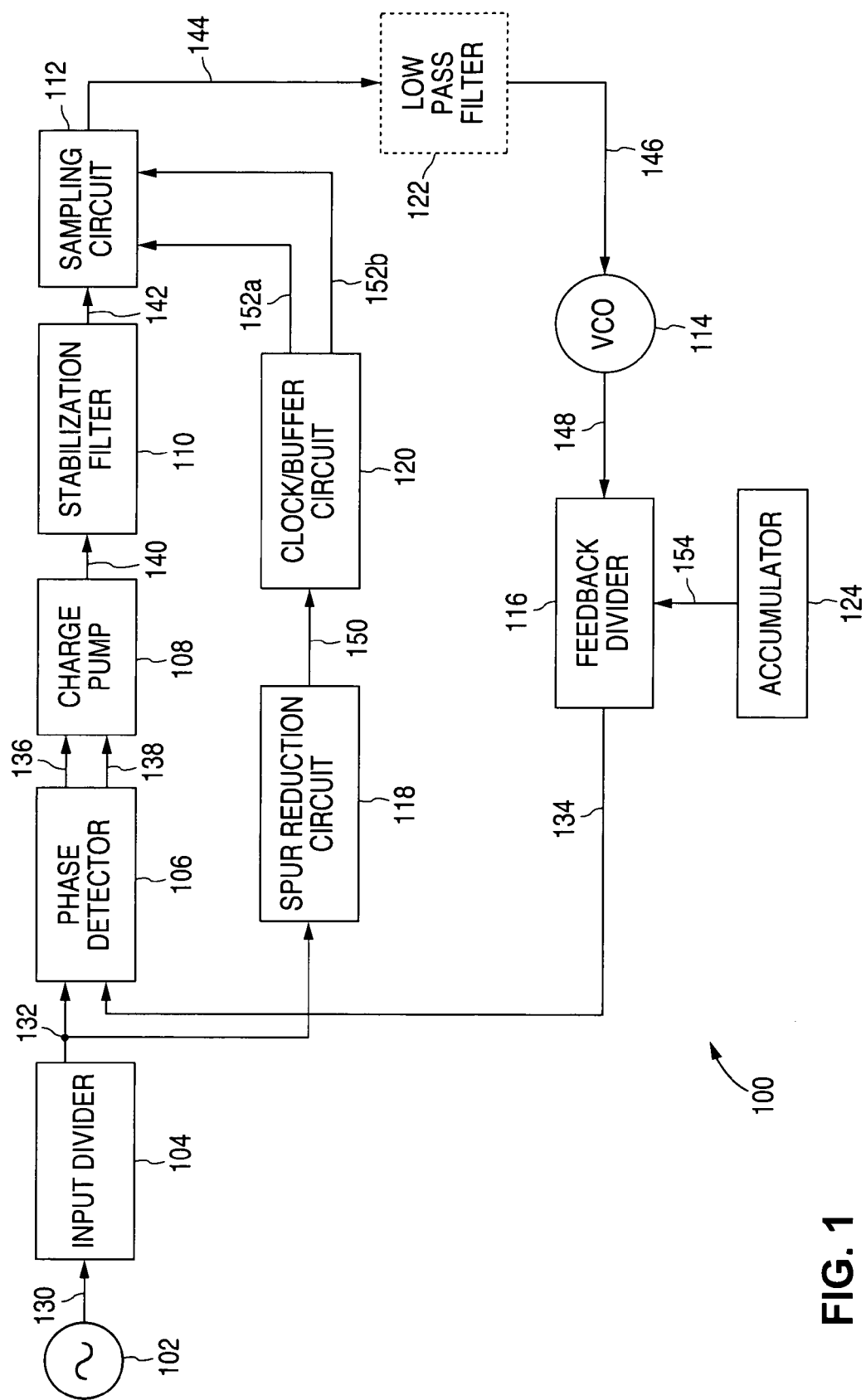
FIG. 1 is a block diagram illustrating a phase-locked loop frequency synthesizer with reduced spurious tones in accordance with one embodiment of the present invention.

FIG. 1 is a block diagram illustrating a phase-locked loop (PLL) frequency synthesizer 100 with reduced spurious tones in accordance with one embodiment of the present invention. For one embodiment, the PLL frequency synthesizer 100 is operable to provide a local oscillator signal for a wireless transceiver or other suitable device based on an external clock signal. However, it will be understood that the PLL frequency synthesizer 100 may perform any suitable function without departing from the scope of the present invention.

The PLL frequency synthesizer 100 comprises a reference frequency source 102, an input divider 104, a phase detector 106, a charge pump 108, a stabilization filter 110, a sampling circuit 112, an oscillator 114, and a feedback divider 116. The PLL frequency synthesizer 100 also comprises a spur reduction circuit 118, a clock/buffer circuit 120, an optional low pass filter 122, and an accumulator 124.

The reference frequency source 102 comprises a crystal oscillator or other suitable frequency source that is operable to generate a reference frequency signal 130. The input divider 104 is coupled to the reference frequency source 102 and is operable to receive the reference frequency signal 130 and to divide the reference frequency signal 130 by a predetermined value, R, to generate a reference clock signal 132. According to one embodiment, R may comprise 10; however, it will be understood that R may comprise any suitable value without departing from the scope of the present invention.

The phase detector 106 is coupled to the input divider 104 and to the feedback divider 116. The phase detector 106 is operable to receive the reference clock signal 132 from the input divider 104 and an internal clock signal 134 from the feedback divider 116. The phase detector 106 is also operable to compare the phase and frequency of the reference clock signal 132 and the internal clock signal 134 and to generate an up signal 136 and/or a down signal 138 based on whether the internal clock signal 134 is faster or slower than the reference clock signal 132. If the internal clock signal 134 is too slow, the phase detector 106 is operable to generate the up signal 136, while if the internal clock signal 134 is too fast, the phase detector 106 is operable to generate the down signal 138.

The charge pump 108 is coupled to the phase detector 106 and is operable to receive the up signal 136 and the down signal 138 from the phase detector 106. The charge pump 108 is also operable to generate a charge pump output signal 140 based on the up and down signals 136 and 138. The charge pump 108 is operable to act as a current source when the up signal 136 is received from the phase detector 106 and as a current sink when the down signal 138 is received from the phase detector 106. Thus, the charge pump 108 may be operable to generate the charge pump output signal 140 by injecting current based on the up signal 136 and by draining current based on the down signal 138.

The stabilization filter 110 is coupled to the charge pump 108 and is operable to receive the charge pump output signal 140. The stabilization filter 110 is also operable to generate a stabilized signal 142 based on the charge pump output signal 140. The sampling circuit 112 is coupled to the stabilization filter 110 and is operable to receive the stabilized signal 142. The sampling circuit 112 is also operable to generate a sampled output signal 144 based on the stabilized signal 142. The optional low pass filter 122 may be coupled between the sampling circuit 112 and the oscillator 114. The low pass filter 122 is operable to receive the sampled output signal 144. The low pass filter 122 is also operable to filter unwanted disturbances in order to generate a loop filter output signal 146 based on the sampled output signal 144.

The oscillator 114 can be coupled directly to the sampling circuit 112 or it can be indirectly coupled to the sampling circuit 112 through the low pass filter 122. The oscillator 114 may comprise a voltage-controlled oscillator or other suitable oscillator. The oscillator 114 is operable to receive either the sampled output signal 144 or the loop filter output signal 146, based on whether or not the low pass filter 122 is included in the PLL frequency synthesizer 100. The oscillator 114 is also operable to generate an output frequency signal 148 based on either the sampled output signal 144 or the loop filter output signal 146.

As the input control voltage for the oscillator 114 increases, the frequency of the output frequency signal 148 also increases, thereby speeding up the internal clock signal 134 generated by the feedback divider 116. As the input control voltage decreases, the frequency of the output frequency signal 148 also decreases, thereby slowing down the internal clock signal 134 generated by the feedback divider 116.

The feedback divider 116 is coupled to the oscillator 114 and to the phase detector 106. The feedback divider 116 is operable to receive the output frequency signal 148 and to generate the internal clock signal 134 based on the output frequency signal 148 by dividing the output frequency signal 148 by a predetermined value, N. According to one embodiment, N may comprise 800; however, it will be understood that N may comprise any suitable value without departing from the scope of the present invention.

For a fractional-N PLL, the accumulator 124 may be used to control the feedback divider 116 and is operable to add an input signal to a stored signal in response to a clocking pulse (not shown in FIG. 1). The accumulator 124 is also operable to generate an accumulator output signal 154 based on the stored signal such that the time average of the feedback divide ratio is the desired fractional divide ratio, N+X/D, with X comprising a specified, positive integer value less than D and D comprising the modulus of the accumulator 124, as described below.

The spur reduction circuit 118 is coupled to the input divider 104 and is operable to receive the reference clock signal 132 and to generate a reduced frequency signal 150 by dividing the reference clock signal 132 by a predetermined value, D, which is the modulus of the accumulator 124. According to one embodiment, D may comprise 15; however, it will be understood that D may comprise any suitable value without departing from the scope of the present invention. The spur reduction circuit 118 is clocked by the falling edge of the output of the input divider 104, if the phase detector 106 is operating upon the rising edge of the output of the input divider 106. Otherwise, it is clocked by the rising edge of the output of the input divider 104. In this way, the charge pump event and the sampling event are isolated in the time-domain.

The clock/buffer circuit 120 is coupled to the spur reduction circuit 118 and is operable to receive the reduced frequency signal 150 and to generate a sampling clock signal 152 based on the reduced frequency signal 150. According to one embodiment, the clock/buffer circuit 120 is operable to generate the sampling clock signal 152 by creating a short pulse based on the reduced frequency signal 150 for a clock signal 152a and by inverting the pulse for an inverted clock signal 152b. The clock/buffer circuit 120 is also operable to buffer the pulses in order to minimize charge injection caused by clock feed-through.

The sampling circuit 112 is also coupled to the clock/buffer circuit 120 and is operable to receive the sampling clock signal 152 and to generate the sampled output signal 144 based on the sampling clock signal 152, in addition to the stabilized signal 142. Therefore, the stabilized signal 142 is sampled by the sampling circuit 112 at a reduced rate as compared to the reference clock signal 132. The reduced rate, $F_s$, is equal to $F_{pd}/D$, where $F_{pd}$ is the operating frequency for the phase detector 106 and D is the modulus of the accumulator 124.

In summary, the output of the phase detector 106 and the charge pump 108 is averaged by the input capacitance of the stabilization filter 110 and is then sampled to the hold capacitor 224. The stabilization filter 110 not only stabilizes the closed loop system but also provides the average of multiple phase errors. Unlike the conventional sampling technique, the disclosed invention does not require a dedicated integration capacitor driven by charge pump to average out phase error.

Furthermore, since the output capacitance of the stabilization filter 110 can be designed to be much larger than that of the hold capacitor, the phase delay introduced by the sampling circuit 112 is greatly reduced, which improves loop dynamic performance. With a properly designed stabilization filter and sampling circuit for any given application, the closed loop system can be guaranteed to be stable. Hence, no anti-saturation circuit is needed to achieve lock. Thus, PLL output spurious tones are reduced by sampling output voltage of the stabilization filter at appropriate rate without using a dedicated integration capacitor and a complex anti-saturation circuit.

Figure 2:
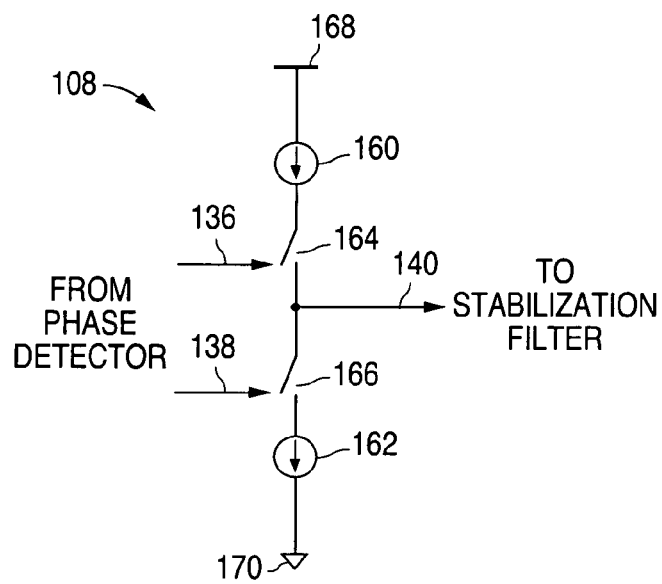
FIG. 2 is a circuit diagram illustrating the charge pump of FIG. 1 in accordance with one embodiment of the present invention.

FIG. 2 is a conceptual circuit diagram illustrating the charge pump 108 in accordance with one embodiment of the present invention. The charge pump 108 comprises a current source 160, a current sink 162, a source switch 164, and a sink switch 166. The current source 160 is coupled to a power source 168 that is operable to provide a specified potential to the charge pump 108 and to a ground 170 that is operable to provide a ground potential to the charge pump 108. According to one embodiment, the current source 160 is operable to provide a current of about 1 amp and the current sink 162 is operable to pull a current of about 1 amp. In addition, the power source 168 is operable to provide about 3 volts and the ground 170 is operable to provide about 0 volts.

The up signal 136 is operable to close the source switch 164 and the down signal 138 is operable to close the sink switch 166. Thus, if the phase detector 106 is providing the up signal 136 to the charge pump 108, the source switch 164 will be closed and the current source 160 will inject current into the stabilization filter 110. Similarly, if the phase detector 106 is providing the down signal 138 to the charge pump 108, the sink switch 166 will be closed and the current sink 162 will drain current from the stabilization filter 110.

Figure 3A:
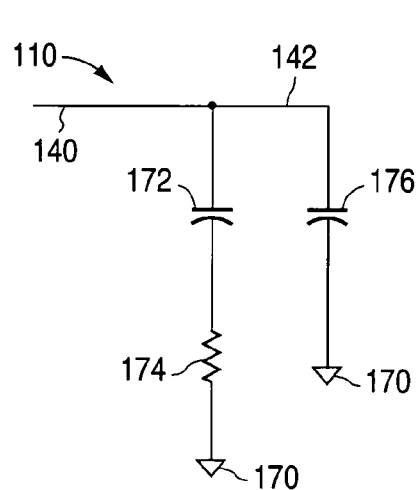
FIG. 3A is a circuit diagram illustrating the stabilization filter of FIG. 1 in accordance with one embodiment of the present invention.

The stabilization filter 110 can be any active or passive filter that provides appropriate phase compensation to stabilize the closed-loop system. FIG. 3A is a circuit diagram illustrating the stabilization filter 110 as a passive filter in accordance with one embodiment of the present invention. According to this embodiment, the passive stabilization filter 110 comprises an RC lead-lag filter. For the illustrated embodiment, the stabilization filter 110 comprises a first capacitor 172 and a resistor 174 coupled in series with each other and also comprises a second capacitor 176 coupled in parallel with the first capacitor 172 and the resistor 174. For one embodiment, the first capacitor 172 comprises about 200 nF, the resistor 174 comprises about 1 kΩ, and the second capacitor 176 comprises about 30 nF. However it will be understood that these components may comprise any suitable capacitance and resistance without departing from the scope of the present invention.

Figure 3B:
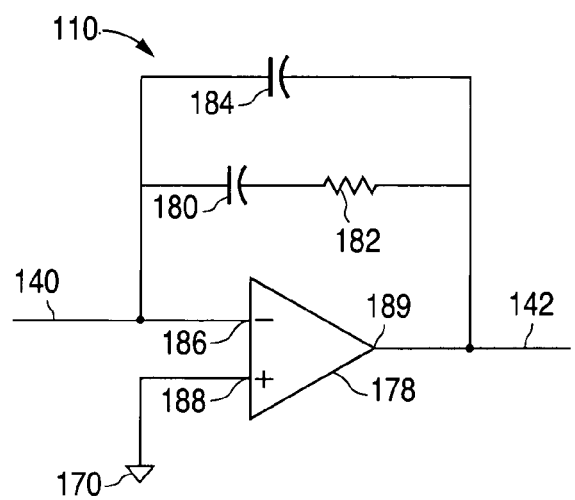
FIG. 3B is a circuit diagram illustrating the stabilization filter of FIG. 1 in accordance with another embodiment of the present invention.

FIG. 3B is a circuit diagram illustrating the stabilization filter 110 as an active filter in accordance with another embodiment of the present invention. According to this embodiment, the active stabilization filter 110 comprises an operational amplifier 178, in addition to a first capacitor 180, a resistor 182 and a second capacitor 184. The first capacitor 180 and the resistor 182 are coupled in series with each other and the second capacitor 184 is coupled in parallel with the first capacitor 180 and the resistor 182. These components 180, 182 and 184 are also coupled to the input 140 and output 142 of the stabilization filter 110.

The operational amplifier 178 comprises an inverting input node 186, a non-inverting input node 188 and an output node 189. The input 140 of the stabilization filter 110 is coupled to the inverting input node 186, while the non-inverting input node 188 is coupled to ground 170. The output node 189 is coupled to the resistor 182, the second capacitor 184 and the output 142 of the stabilization filter 110. For one embodiment, the first capacitor 180 comprises about 200 nF, the resistor 182 comprises about 1 kΩ, and the second capacitor 184 comprises about 30 nF. However it will be understood that these components may comprise any suitable capacitance and resistance without departing from the scope of the present invention.

For some applications, the optional low pass filter 122 can be used to provide additional filtering of the spurious tones. FIG. 4A is a circuit diagram illustrating the optional low pass filter 122 as a passive filter in accordance with one embodiment of the present invention. According to this embodiment, the passive low pass filter 122 comprises a first resistor 190, a second resistor 192, a first capacitor 194, and a second capacitor 196. The input 144 of the low pass filter 122 is coupled to the first resistor 190 and the output 146 of the low pass filter 122 is coupled to the second resistor 192 and the second capacitor 196.

The resistors 190 and 192 are coupled in series with each other. The first capacitor 194 is coupled to the resistors 190 and 192 at one end and the ground 170 at the other end. The second capacitor 196 is coupled between the second resistor 192 and the ground 170. For one embodiment, the first resistor 190 comprises about 1 kΩ, the second resistor 192 comprises about 1 kΩ, the first capacitor 194 comprises about 100 pF, and the second capacitor 196 comprises about 100 pF. However it will be understood that these components may comprise any suitable capacitances and resistances without departing from the scope of the present invention.

FIG. 4B is a circuit diagram illustrating the optional low pass filter 122 as an active filter in accordance with another embodiment of the present invention. The active low pass filter 122 might be used for applications requiring a high tuning voltage. According to this embodiment, the active low pass filter 122 comprises an operational amplifier 200, in addition to a first resistor 202, a first capacitor 204, a second capacitor 206, and a second resistor 208.

The operational amplifier 200 comprises an inverting input node 210, a non-inverting input node 212, and an output node 214. The input 144 of the low pass filter 122 is coupled to the inverting input node 210 through the first resistor 202, while the non-inverting input node 212 is coupled to ground 170. The first capacitor 204 is coupled to the inverting input node 210 and the second capacitor 206. The second resistor 208 is coupled in parallel with the first capacitor 204. The output node 214 is coupled to the second capacitor 206 and the output 146 of the low pass filter 122.

For one embodiment, the first resistor 202 comprises about 1 kΩ, the first capacitor 204 comprises about 100 pF, the second capacitor 206 comprises about 100 pF, and the second resistor 208 comprises about 1 kΩ. However it will be understood that these components may comprise any suitable capacitances and resistances without departing from the scope of the present invention.

It will be understood that low pass filters 122 shown in FIG. 4A and FIG. 4B are only for demonstration of a basic principle. The topology and/or order of the optional low pass filter 122 can be easily varied for given applications without departing from the scope of the present invention.

FIG. 5 is a circuit diagram illustrating the sampling circuit 112 and the clock/buffer circuit 120 in accordance with one embodiment of the present invention. The sampling circuit 112 can be any suitable sample-hold circuitry found in typical sampled-data systems. For this embodiment, the sampling circuit 112 comprises an n-channel transistor 220, a p-channel transistor 222, and a hold capacitor 224. The transistors 220 and 222 are coupled to the clock/buffer circuit 120. The gate of the n-channel transistor 220 is operable to receive the clock signal 152*a*, while the gate of the p-channel transistor 222 is operable to receive the inverted clock signal 152b. Thus, when the clock signal 152a is high and the inverted clock signal 152b is low, both transistors 220 and 222 are on, allowing the stabilized signal 142 to be sampled by the sampling circuit 112. However, when the clock signal 152a is low and the inverted clock signal 152b is high, both transistors 220 and 222 are off, preventing the stabilized signal 142 from being passed through the sampling circuit 112. The hold capacitor 224 is operable to store the sampled voltage. For one embodiment, the input of oscillator 114 is directly coupled to the output of the sampling circuit 112. Part or all of the hold capacitor 224 can be the input capacitance of the oscillator 114. For one embodiment, the hold capacitor 224 comprises about 50 pF. However it will be understood that the hold capacitor 224 may comprise any suitable capacitance without departing from the scope of the present invention. For another embodiment, the input of the oscillator 114 is coupled to the output of the low pass filter 122, which is driven by the sampling circuit 112. The effective sampling capacitance is the sum of the input capacitance of the low pass filter 122 and the hold capacitor 224.

The clock/buffer circuit 120 can be any circuit that creates a short pulse at the rising/falling edge of an input signal and provides a clock buffering function. For one embodiment, the clock/buffer circuit 120 comprises a D flip-flop 230, a delay circuit 232, a first buffer 234 and a second buffer 236. The D flip-flop 230 is operable to receive the input 150 for the clock/buffer circuit 120, in addition to a power signal 238. According to one embodiment, the power signal 238 is operable to provide about 3 volts. However, it will be understood that the power signal 238 may provide any other suitable amount of power without departing from the scope of the present invention.

The D flip-flop 230 is operable to generate an internal clock signal 240 and an inverted internal clock signal 242 based on the input 150 to the clock/buffer circuit 120. The delay circuit 232 is operable to delay the internal clock signal 240 and provide the delayed clock signal 248 back to the D flip-flop 230 as a clear signal. The first buffer 234 is operable to buffer the internal clock signal 240 to generate the clock signal 152a and the second buffer 236 is operable to buffer the inverted internal clock signal 242 to generate the inverted clock signal 152b. Thus, the output 152a of the first buffer 234 is coupled to the gate of the n-channel transistor 220, while the output 152b of the second buffer 236 is coupled to the gate of the p-channel transistor 222.

Figure 6:
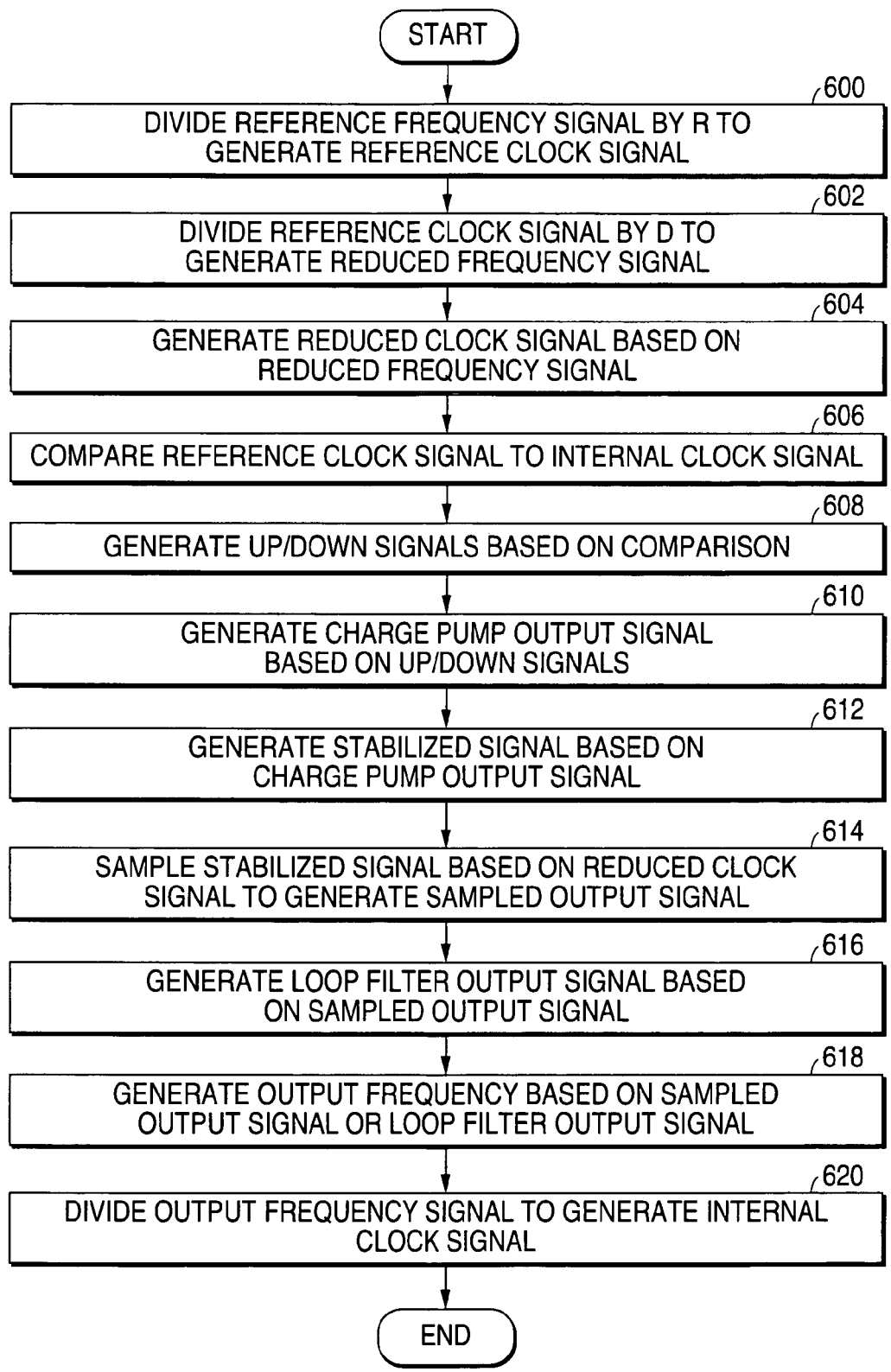
FIG. 6 is a flow diagram illustrating a method for providing a phase-locked loop with reduced spurious tones in accordance with one embodiment of the present invention.

FIG. 6 is a flow diagram illustrating a method for providing a PLL, such as the PLL frequency synthesizer 100, with reduced spurious tones in accordance with one embodiment of the present invention. The method begins at step 600 where the input divider 104 divides the reference frequency signal 130 by a predetermined value, R, to generate the reference clock signal 132.

At step 602, the spur reduction circuit 118 generates the reduced frequency signal 150 by dividing the reference clock signal 132 by a predetermined value, D, which is the modulus of the accumulator 124. At step 604, the clock/buffer circuit 120 generates the sampling clock signal 152 based on the reduced frequency signal 150. According to one embodiment, the clock/buffer circuit 120 generates the sampling clock signal 152 by creating a pulse based on the reduced frequency signal 150 for a clock signal 152a and by buffering the pulse for an inverted clock signal 152b.

At step 606, the phase detector 106 compares the reference clock signal 132 to the internal clock signal 134. At step 608, the phase detector 106 generates an up signal 136 or a down signal 138 based on the comparison of the reference clock signal 132 to the internal clock signal 134. At step 610, the charge pump 108 generates a charge pump output signal 140 based on the up and down signals 136 and 138. The charge pump 108 sources current based on the up signal 136 and sinks current based on the down signal 138 to generate the charge pump output signal 140.

At step 612, the stabilization filter 110 generates a stabilized signal 142 based on the charge pump output signal 140. According to one embodiment, the stabilization filter 110 comprises a capacitor that is charged up by the charge pump output signal 140 when the phase detector 106 generates the up signal 136 for the charge pump 108 and is drained by the charge pump output signal 140 when the phase detector 106 generates the down signal 138 for the charge pump 108. At step 614, the sampling circuit 112 generates the sampled output signal 144 by sampling the stabilized signal 142 based on the sampling clock signal 152.

At optional step 616, the low pass filter 122 generates a loop filter output signal 146 based on the sampled output signal 144. At step 618, the oscillator 114 generates an output frequency signal 148 based on either the sampled output signal 144 or the loop filter output signal 146, depending on whether or not the optional step 616 is performed. At step 620, the feedback divider 116 generates the internal clock signal 134 based on the output frequency signal 148 by dividing the output frequency signal 148 by a predetermined amount. The predetermined amount may comprise either N or N+X/D.

In this way, the phase error is averaged by the large input capacitance of the stabilization filter 110, rather than a dedicated integration capacitor as in the conventional technique. The stabilization filter 110 also provides suitable phase compensation to stabilize the closed loop system. Also, the disclosed invention does not suffer from the saturation effect and the closed loop is guaranteed to be stable with a properly designed stabilization filter 110 and sampling circuit 112. The PLL system transient performance is improved and spurious tones are reduced without using a complex anti-saturation circuit.

Although the present invention has been described with several embodiments, various changes and modifications may be suggested to one skilled in the art. It is intended that the present invention encompass such changes and modifications as fall within the scope of the appended claims.

What is claimed is:

1. A method for providing a phase-locked loop with reduced spurious tones, comprising:

comparing a reference clock signal to an internal clock signal to generate a first signal;

generating a sampling clock signal by creating a pulse to generate a clock signal and buffering the pulse to generate an inverted clock signal, the pulse generated based on a divided reference clock signal, the sampling clock signal having a reduced frequency with respect to the reference clock signal;

sampling the first signal based on the sampling clock signal to generate a second signal; and generating the internal clock signal based on the second signal.

2. The method of claim 1, further comprising:

generating at least one of an up signal and a down signal based on the comparison of the reference clock signal to the internal clock signal;

generating a charge pump output signal based on at least one of the up and down signals;

generating the first signal based on the charge pump output signal;
generating an output frequency signal based on the second signal; and
dividing the output frequency signal by a first predetermined amount to generate the internal clock signal.

3. The method of claim 2, generating the charge pump output signal comprising sourcing current based on the up signal and sinking current based on the down signal, and generating a stabilized signal comprising injecting currents into a stabilization filter based on the up signal and draining currents from the stabilization filter based on the down signal.

4. The method of claim 3, further comprising generating a loop filter output signal based on the second signal and generating the output frequency signal based on the second signal comprising generating the output frequency signal based on the loop filter output signal.

5. The method of claim 2, the first predetermined amount comprising one of a predetermined value N and N+X/D, D comprising a predetermined value, and X comprising a predetermined positive integer value less than D.

6. The method of claim 1, further comprising:
dividing a reference frequency signal by a predetermined value, R, to generate the reference clock signal; and
dividing the reference clock signal by a predetermined value, D, to generate a reduced frequency signal,
wherein the sampling clock signal is generated based on the reduced frequency signal.

7. The method of claim 6, further comprising:
generating an output frequency signal based on the second signal; and
dividing the output frequency signal by a first predetermined amount to generate the internal clock signal,
wherein the first predetermined amount comprises one of a predetermined value N and a fractional divide ratio N+X/D, X comprising a predetermined positive integer value less than D.

8. A method for providing a phase-locked loop with reduced spurious tones, comprising:
dividing a reference clock signal by a predetermined value, D, to generate a reduced frequency signal;
generating a sampling clock signal by creating a pulse based on the reduced frequency signal to generate a clock signal and buffering the pulse to generate an inverted clock signal;
comparing the reference clock signal to an internal clock signal;
generating at least one of an up signal and a down signal based on the comparison of the reference clock signal to the internal clock signal;
generating a charge pump output signal based on at least one of the up and down signals;
generating a stabilized signal based on the charge pump output signal;
sampling the stabilized signal based on the sampling clock signal to generate a sampled output signal;
generating an output frequency signal based on the sampled output signal; and
dividing the output frequency signal by a first predetermined amount to generate the internal clock signal.

9. The method of claim 8, further comprising dividing a reference frequency signal by a predetermined value, R, to generate the reference clock signal.

10. The method of claim 9, the first predetermined amount comprising one of a predetermined value N and N+X/D, X comprising a predetermined positive integer value less than D.

11. The method of claim 8, generating the charge pump output signal comprising sourcing current based on the up signal and sinking current based on the down signal.

12. The method of claim 8, generating the stabilized signal comprising injecting currents into a stabilization filter based on the up signal and draining currents from the stabilization filter based on the down signal.

13. The method of claim 8, further comprising generating a loop filter output signal based on the sampled output signal, generating the output frequency signal based on the sampled output signal comprising generating the output frequency signal based on the loop filter output signal.

14. The method of claim 8, wherein generating a stabilized signal comprises filtering the charge pump output signal with an active filter.

15. A phase-locked loop, comprising:
a spur reduction circuit operable to receive a reference clock signal and to divide the reference clock signal by a predetermined value, D, to generate a reduced frequency signal;
a clock/buffer circuit coupled to the spur reduction circuit, the clock/buffer circuit operable to generate a sampling clock signal by creating a pulse based on the reduced frequency signal to generate a clock signal, inverting the pulse to generate an inverted clock signal, and buffering the clock signal and the inverted clock signal;
a phase detector operable to compare the reference clock signal to an internal clock signal to generate at least one of an up signal and a down signal;
a charge pump coupled to the phase detector, the charge pump operable to generate a charge pump output signal based on at least one of the up and down signals;
a stabilization filter coupled to the charge pump, the stabilization filter operable to generate a stabilized signal based on the charge pump signal;
a sampling circuit coupled to the stabilization filter and the clock/buffer circuit, the sampling circuit operable to sample the stabilized signal based on the sampling clock signal to generate a sampled output signal;
an oscillator coupled to the sampling circuit, the oscillator operable to generate an output frequency signal based on the sampled output signal; and
a feedback divider coupled between the oscillator and the phase detector, the feedback divider operable to divide the output frequency signal by a first predetermined amount to generate the internal clock signal.

16. The phase-locked loop of claim 15, further comprising an input divider coupled to the phase detector and to the spur reduction circuit, the input divider operable to divide a reference frequency signal by a predetermined value, R, to generate the reference clock signal.

17. The phase-locked loop of claim 16, the first predetermined amount comprising one of N and N+X/D, X comprising a predetermined positive integer value less than D.

18. The phase-locked loop of claim 15, the sampling circuit comprising an n-channel transistor, a p-channel transistor and a hold capacitor, the n-channel transistor comprising a gate operable to receive the clock signal and the p-channel transistor comprising a gate operable to receive the inverted clock signal.

19. The phase-locked loop of claim 15, further comprising a low pass filter coupled between the sampling circuit and the oscillator, the low pass filter operable to generate a loop filter output signal based on the sampled output signal, the oscillator operable to generate the output frequency signal based on the loop filter output signal.

20. The phase-locked loop of claim 15, wherein the stabilization filter comprises an active filter.

* * * * *